(12) United States Patent
Joseph et al.

(10) Patent No.: US 8,745,115 B2
(45) Date of Patent: Jun. 3, 2014

(54) PIXEL SENSOR CONVERTERS AND ASSOCIATED APPARATUS AND METHODS

(75) Inventors: Dileepan Joseph, Edmonton (CA); Alireza Mahmoodi, Edmonton (CA)

(73) Assignee: The Governors of the University of Alberta, Edmonton, Alberta (CA)

( * ) Notice: Subject to any disclaimer, the term of this patent is extended or adjusted under 35 U.S.C. 154(b) by 598 days.

(21) Appl. No.: 12/853,115

(22) Filed: Aug. 9, 2010

(65) Prior Publication Data

US 2011/0035427 A1 Feb. 10, 2011

Related U.S. Application Data

(60) Provisional application No. 61/232,363, filed on Aug. 7, 2009.

(51) Int. Cl.
*G06F 17/17* (2006.01)
(52) U.S. Cl.
USPC .......................................................... 708/313
(58) Field of Classification Search
CPC .............. H03H 17/0664; H03H 17/17; H03H 17/0657; H03H 17/0671; H03H 17/0685
USPC .......................................................... 708/313
See application file for complete search history.

(56) References Cited

U.S. PATENT DOCUMENTS

| | | | | |
|---|---|---|---|---|
| 4,881,191 A | * | 11/1989 | Morton | 708/313 |
| 4,985,905 A | | 1/1991 | Kubinec | |
| 5,168,214 A | * | 12/1992 | Engeler et al. | 708/313 |
| 5,248,971 A | * | 9/1993 | Mandl | 341/141 |
| 5,329,553 A | * | 7/1994 | Abbiate et al. | 708/313 |
| 5,548,540 A | * | 8/1996 | Staver et al. | 708/313 |
| 2009/0289823 A1 | * | 11/2009 | Chae et al. | 341/143 |
| 2009/0295956 A1 | * | 12/2009 | Chae et al. | 708/313 |
| 2011/0095923 A1 | * | 4/2011 | Ignjatovic et al. | 341/137 |

OTHER PUBLICATIONS

L.G. McIlrath, "A Low-Power, Low-Noise, Ultrawide-Dynamic-Range CMOS Imager with Pixel-Parallel A/D Conversion," IEEE Journal of Solid-State Circuits, vol. 36, pp. 846-853, May 2001.
B. Fowler, A. El Gamal, and D.X.D. Yang, "A CMOS Area Image Sensor with Pixel-Level A/D Conversion," in IEEE International Solid-State Circuits Conference, Feb. 16-18, 1994, pp. 226-227.
B. Fowler, A. El Gamal, and D.X.D. Yang, "Techniques for Pixel Level Analog to Digital Conversion," in Proceedings of SPIE, 1998, vol. 3360, pp. 1-12.

(Continued)

*Primary Examiner* — Tan V. Mai
(74) *Attorney, Agent, or Firm* — Anthony R. Lambert

(57) ABSTRACT

There is described a pixel sensor converter for an image sensor array. In particular, a pixel sensor converter comprising: a delta-sigma converter comprising a modulator and a decimator. In some examples, the modulator is configured to be in communication with a detector, such as a photo-detector, and is configured to sample an analogue signal received from a detector at a particular sampling rate. The modulator is further configured to provide a bit stream of a particular bit rate. The provided bit stream corresponds to a sampled analogue signal. The decimator is in communication with the modulator, and is configured to receive and modify a bit stream provided from the modulator in order to provide a digital output signal. The provided digital output signal is representative of an analogue signal received at the modulator, but having a reduced bit rate than a corresponding bit stream provided by the modulator.

15 Claims, 9 Drawing Sheets

(56) References Cited

OTHER PUBLICATIONS

Y. Joo, J. Park, M. Thomas, K.S. Chung, M.A. Brooke, N.M. Jokerst, and D.S. Wills, "Smart CMOS Focal Plane Arrays: A Si CMOS Detector Array and Sigma-Delta Analog-to-Digital Converter Imaging System," IEEE Journal of Selected Topics in Quantum Electronics, vol. 5, No. 2, pp. 296-305, 1999.

J.G. Rocha, N.F. Ramos, R.F. Wolffenbuttel, and J.H. Correia, "CMOS X-ray Image Sensor with Pixel Level A/D Conversion," in Proceedings of the 29th European Solid-State Circuits Conference, 2003, pp. 121-124.

D.X.D. Yang, B. Fowler, and A. El Gamal, "A 128* 128 Pixel CMOS Area Image Sensor with Multiplexed Pixel Level A/D Conversion," in IEEE Custom Integrated Circuits Conference, May 5-8, 1996, pp. 303-306.

D. Maricic, Z. Ignjatovic, and M.F. Bocko, "An Oversampling Digital Pixel Sensor with a Charge Transfer DAC Employing Parasitic Capacitances," in Proceedings of the IEEE Midwest Symposium on Circuits and Systems, 2009, pp. 415-418.

D.D. Kim and M.A. Brooke, "Scalable Delta-Sigma Modulator Readout Architecture for Array-based Sensor System," in Proceedings of IEEE International Symposium on Circuits and Systems, 2006.

A. Mahmoodi and D. Joseph, "Optimization of Delta-Sigma ADC for Column-Level Data Conversion in CMOS Image Sensors," in Proceedings of the IEEE Instrumentation and Measurement Technology Conference, May 1-3, 2007, pp. 1-6.

\* cited by examiner

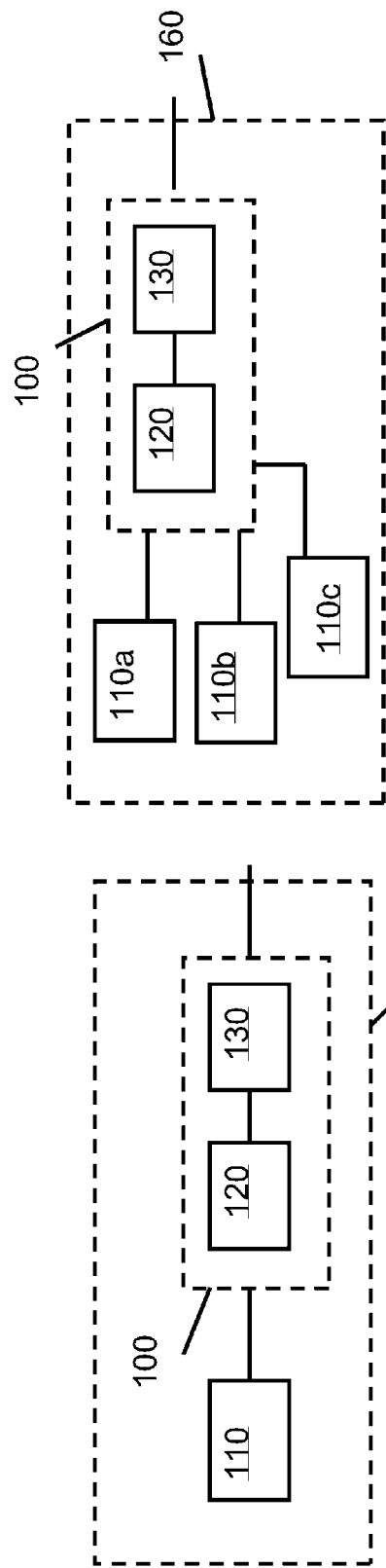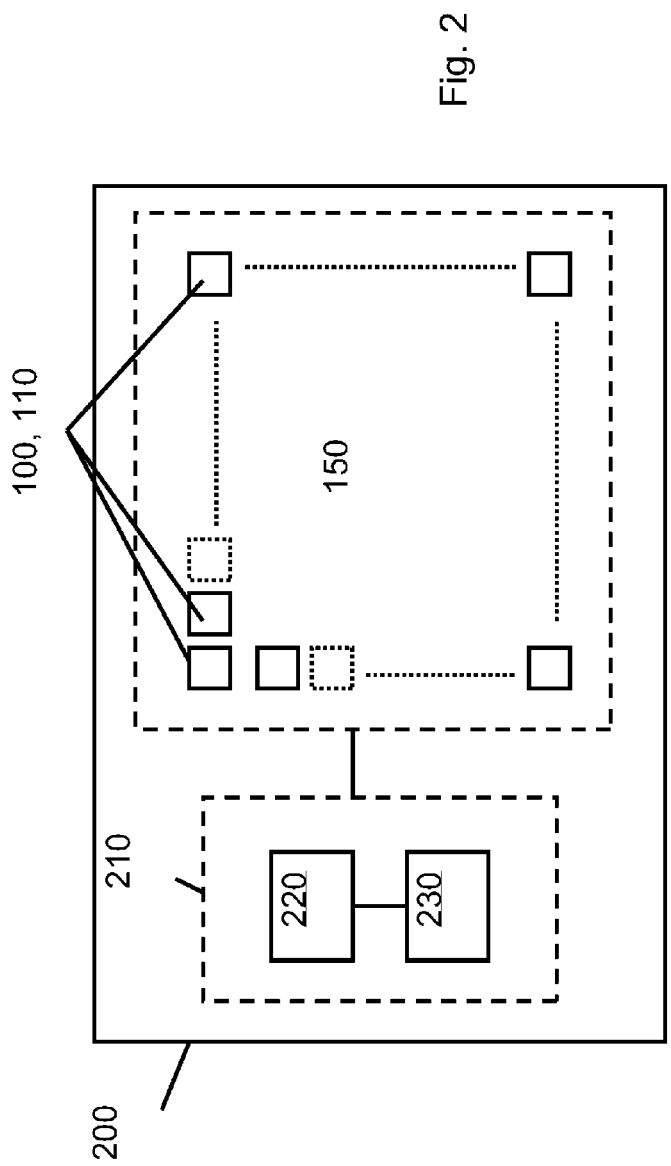

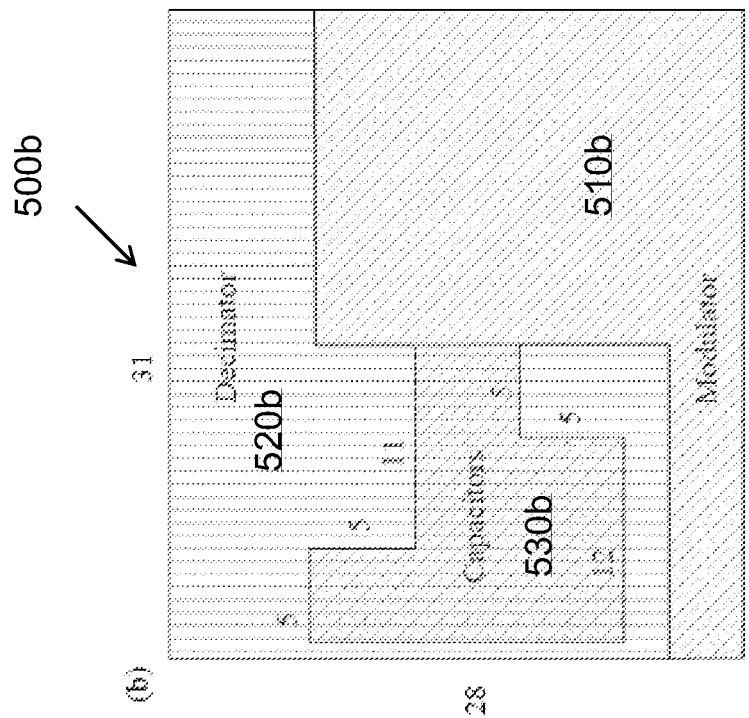
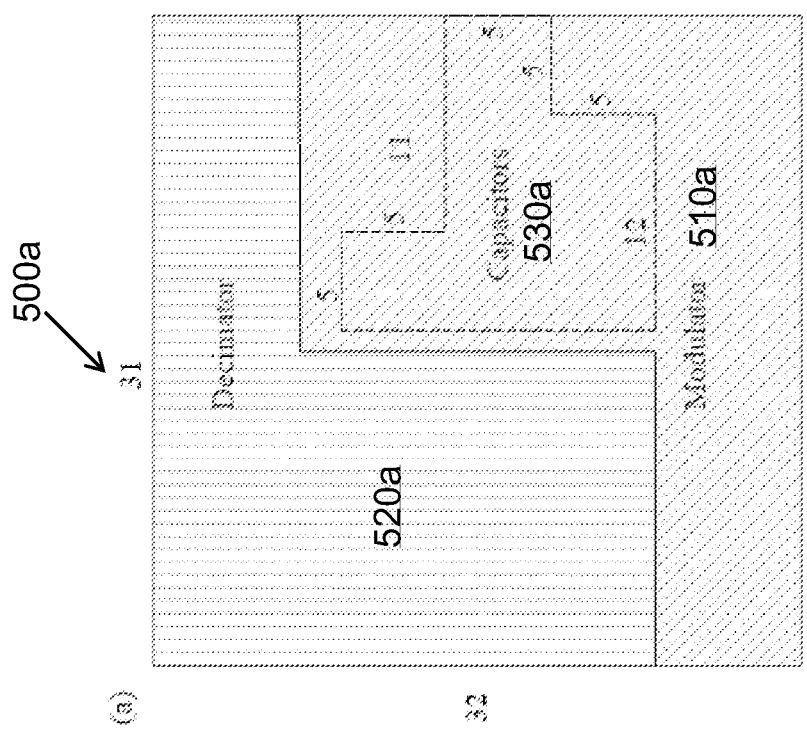
Fig. 7b
Fig 7a

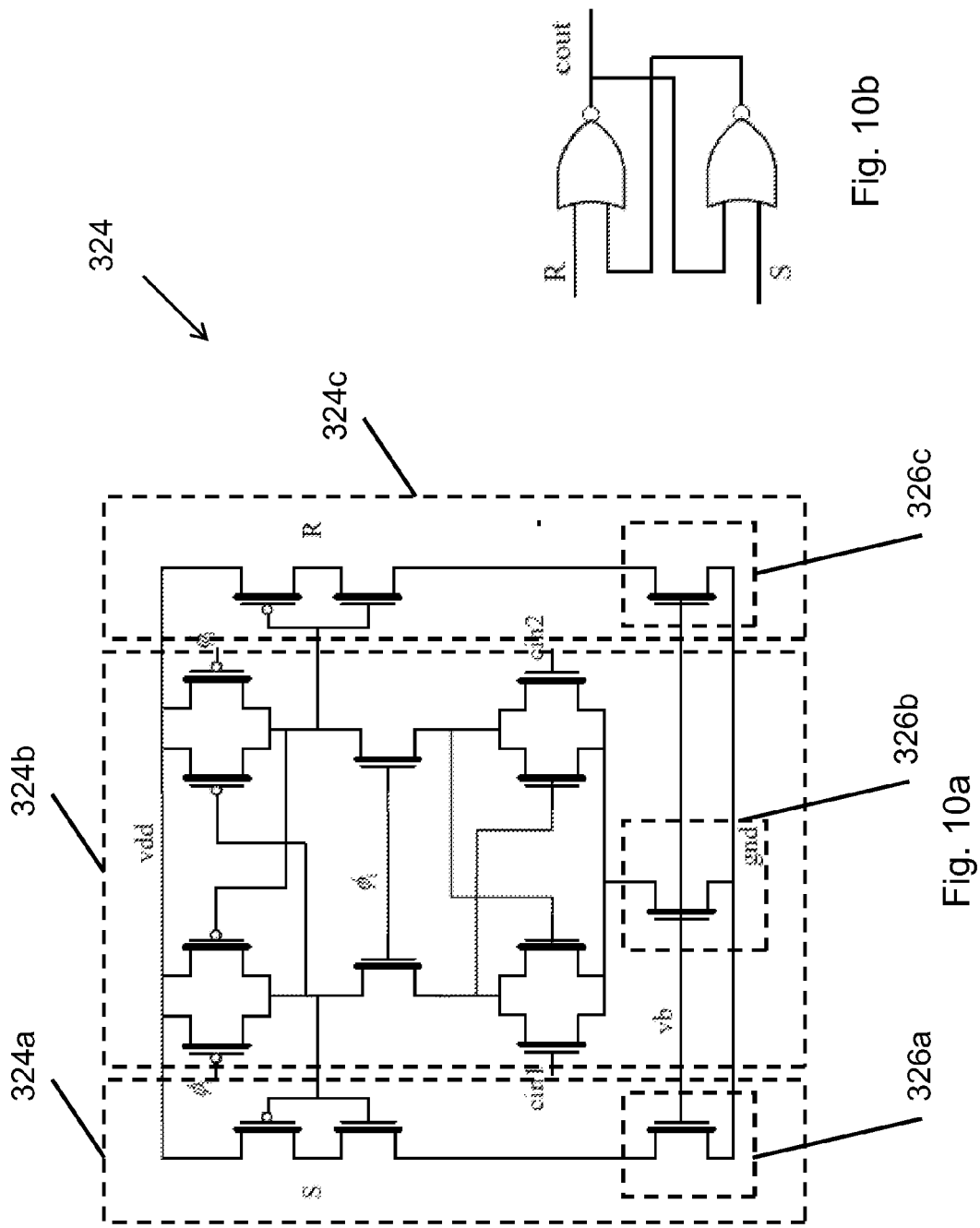

PIXEL SENSOR CONVERTERS AND ASSOCIATED APPARATUS AND METHODS

CROSS-REFERENCE TO RELATED APPLICATIONS

This application claims the benefit under 35 USC 119(e) of U.S. provisional No. 61/232,363 filed Aug. 7, 2009.

TECHNICAL FIELD

The invention relates to the field of pixel sensor converters, and associated apparatus, and methods. In particular, the invention relates to apparatus for use with pixel sensors converters, such as decimators for delta-sigma converters, and associated methods.

Certain embodiments describe novel layouts of such pixel sensor converters, which includes novel circuit architecture, novel die layouts, etc.

BACKGROUND

Image sensor arrays are used in many applications to obtain images digitally. Image sensor arrays generally comprise a plurality of discrete pixel sensors, which in some cases are arranged in columns. Each pixel sensor serves to convert a detected signal incident upon a detector to an electrical signal. In the example of a photo-detector configured to detect an electromagnetic signal, a photodiode and some form of analogue-to-digital conversion is employed. Image sensor arrays include Complementary Metal Oxide Semiconductors (CMOS) sensor arrays, Charge Coupled Device arrays (CCD), and the like.

The specification of an image sensor array, such as a CMOS image sensor array, can be described in several terms. Two terms of particular importance are dynamic range (DR) and signal-to-noise ratio (SNR). In many applications, a high dynamic range and high signal-to-noise ratio are preferred.

Linear sensors achieve a high signal-to-noise ratio, at least in part, by using photocurrent integration. However, such sensors tend to have a lower dynamic range, when compared to non-linear sensors. Time-based linear sensors have a higher dynamic range, but need a longer integration time, which limits the frame rate.

Logarithmic sensors have been shown to provide a dynamic range of over 160 dB. Such sensors generally require no integration capacitance. However, these sensors can suffer from high fixed-pattern noise and low signal-to-noise ratio. Certain calibration methods can be employed to reduce fixed pattern noise. However, the low signal-to-noise ratio continues to be a problem.

A delta-sigma analogue-to-digital converter for signal conversion can achieve higher signal-to-noise ratios, and may be used to improve the signal-to-noise ratio of image sensors, such as logarithmic image sensors.

Previous work by the inventor in this field was published in "Optimization of delta-sigma adc for column-level data conversion in cmos image sensors," in *Instrumentation and Measurement Technology Conference Proceedings, 2007 IEEE*, 1-3 May 2007, pp. 1-6.

The listing or discussion of a prior-published document or any background in this specification should not necessarily be taken as an acknowledgement that the document or background is part of the state of the art or is common general knowledge. One or more of the above prior-published documents or issues raised in the background may, or may not have been considered by, or known to, the inventor or have been published prior to the date of invention.

SUMMARY

The following summary provides particular features or aspects of the invention identified by the inventor. Features which are merely optional, or additional, but that may, in some cases, provide an additional benefit, over and above the identified invention, have also been provided. The listing or discussion of such features below should in no way be taken that those features are essential for the invention to be implemented. Similarly, one or more of the features provided in the aspects of the invention may or may not be essential for the invention.

According to a first aspect of the invention there is provided a pixel sensor converter for an image sensor array, the pixel sensor converter comprising:

a delta-sigma converter comprising a modulator and a decimator; wherein the modulator is configured to be in communication with a detector and is configured to sample an analogue signal received from a detector at a particular sampling rate, the modulator further configured to provide a bit stream of a particular bit rate, such a bit stream corresponding to a sampled analogue signal; and wherein the decimator is in communication with the modulator, and is configured to receive and modify a bit stream provided from the modulator in order to provide a digital output signal, such a digital output signal representative of an analogue signal received at the modulator, but having a reduced bit rate than a corresponding bit stream provided by the modulator.

The decimator may be configured to serially modify a bit stream. The decimator may comprise an accumulator in order to modify a bit stream. The accumulator may be configured to modify bits associated with a bit stream using one or more 1-bit registers. The accumulator may be configured to modify bits associated with a bit stream using one or more 1-bit adders. The accumulator may comprise a 1-bit register and a 1-bit adder. The accumulator may be configured to add together bits associated with a received bit stream. The accumulator may be considered to add the bits one bit at a time.

The accumulator may further comprise a shift register. The shift register may be configured to store the sum of bits added. The size of the shift register may be commensurate with the desired signal-to-noise ratio of the pixel sensor converter. The output from the shift register may provide the digital output signal of the pixel sensor converter. The accumulator may comprise one or more pulsed latches. The accumulator may comprise one or more D-type flip flops. The accumulator may be realised using one or more D-type flip flops. The D-type flip flop may use two pulsed latches. The accumulator may be realised using one or more pulsed latches.

The decimator may be configured to filter bits associated with a bit stream in order to provide a filtered bit stream. The decimator may be configured to filter a bit stream received from the modulator, wherein the filtered bits are providable to the accumulator. The decimator may be configured to filter a bit stream digitally. The decimator may be configured to act as a finite impulse response filter in order to provide a digital output signal. The impulse response may have a parabolic shape.

Coefficients for the finite impulse response filter may be associated with the sampling rate of the modulator. Coefficients may be determined from the sampling rate of the modulator. The pixel sensor converter may be configured to receive coefficients for use in the decimator, such as receive from further circuitry, such as processing circuitry or the like.

The modulator may be configured to provide bit streams comprising one or more frames. Each frame may comprise a series of frame bits associated with a particular sample of a received analogue signal. The decimator may be configured to use received coefficients with each frame bit of a frame in order to provide a filtered bit stream. The filtered bit stream may be usable with the accumulator to provide the digital signal output. The decimator may be configured to use coefficients and frame bits serially in order to provide a filtered output. The decimator may be configured to AND (or equivalent) received coefficients with each frame bit of a frame in order to provide a filtered output.

Therefore, a filtered bit stream provided by the decimator may comprise a series of filtered bits for use serially with the accumulator. The decimator may be considered to filter a bit stream one bit at a time.

The decimator may be configured to be in communication with further apparatus, such as processing circuitry, in order to provide for storage, further processing, etc., a digital output signal.

The decimator may be considered to filter a bit stream at the pixel sensor converter. The decimator may be considered to down-sample a bit stream at the pixel sensor converter.

The decimator, or parts of the decimator, may be implemented using PMOS circuitry. The decimator, or parts of the decimator, may be implemented using NMOS circuitry.

The converter may be provided on a semiconductor die (e.g. a single die). The die may comprise circuitry for the modulator, circuitry for the decimator, and capacitors for use with at least one of the modulator and decimator. The die may be considered layered. The capacitors may partially or fully overlap with the circuitry for the decimator or the circuitry for the modulator. Capacitors for use with the modulator may fully overlap with the circuitry for the decimator.

The modulator may be a first order modulator. The modulator may comprise an operational transconductance amplifier, which may be configured for communication with a detector in order to receive an analogue signal. The modulator may comprise a comparator in communication with the operational transconductance amplifier in order to provide a bit stream to the decimator. The comparator may be configured as a latch comparator, such as a regenerative latch comparator.

The comparator may be a regenerative latch comparator. The comparator may be a modified regenerative latch comparator. The comparator may comprise one or more power limiters. The one or more power limiters may be configured to limit the maximum current of the comparator. The one or more power limiters may be associated with one or more branches of the comparator. At least one of the one or more power limiters may be provided by one or more transistors.

The modulator, or parts of the modulator, may be implemented using PMOS circuitry. The modulator, or parts of the modulator, may be implemented using NMOS circuitry.

According to a second aspect of the invention there is provided a pixel sensor comprising a pixel sensor converter according to any of the features of the first aspect of the invention.

The pixel sensor may comprise a detector in communication with the modulator. The detector may be a non-linear detector. The detector may be a logarithmic detector.

The detector may be a photo-detector. The photo-detector may be configured to detect electromagnetic wave signals from any band of the electromagnetic spectrum, including but not limited to the millimeter wave, infrared, terahertz, visible, ultraviolet, X-ray, and gamma ray bands.

The detector may be a pressure detector. For example, the detector may be an ultrasonic detector, which may be configured for use with an ultrasonic image sensor.

The detector may be a chemical detector. For example, the detector may be an olfactory detector.

The detector may comprise one or more detector elements. Each detector element may be configured to detect a particular signal. For example, a photo-detector may comprise more than one detector element, such as two, three, four, five, ten, twenty, one hundred, or any number there between. Some of the detector elements may be configured to detect different signal properties from the other detector elements. Each of the detector elements may be configured to detect different detector properties.

For example, one or some of the detector element may be configured to detect particular acoustic frequencies, particular chemicals, particular electromagnetic waves, while the others may be configured to detect other frequencies/chemicals/waves.

For example, in an image sensor for detecting colour, an effective colour pixel may be derived from neighbouring detector elements, such as having two of which sense green light and the other two of which sense red and blue light respectively.

The analogue signal from each detector element may be multiplexed so as to provide an analogue signal to the converter.

The pixel sensor may be configured with further pixel sensors to provide a column sensor.

According to a third aspect of the invention there is provided an image sensor array comprising a plurality of pixel sensors according to any of the features of the second aspect. The pixel sensor may be configured in columns.

The image sensor array may be configured for photo-imaging (e.g. electromagnetic spectrum), chemical imaging, pressure imaging (e.g. acoustic, such as ultrasonic).

According to a fourth aspect of the invention there is provided an image sensor comprising one or more image sensor arrays according to the third aspect. The image sensor may comprise processing circuitry, such as a processor and memory configured in a known manner (e.g. using a field programmable gate array, application specific integrated circuit, programmable intelligent computer, or the like).

The processing circuitry may be configured to provide coefficients for use with one or more decimators (e.g. all decimators). The processing circuitry may be configured to receive a digital output signal from one or more decimators (e.g. all decimators). The processing circuitry may be configured to store a digital output signal. The processing circuitry may be configured to process a digital output signal for use with a further device or apparatus.

According to a fifth aspect of the invention there is provided an imaging device comprising an image sensor according to any of the features of the fourth aspect, or an image sensor array according to any of the features of the third aspect or a pixel sensor according to any of the features of the second aspect, or a pixel sensor converter according to any of the features of the second aspect The imaging device may be a photographic device. The imaging device may be a video device. The imaging device may be a portable electronic device. The imaging device may be pressure imaging/detecting device. The imaging device may be a chemical detecting/imaging device.

According to a sixth aspect of the invention there is provided a column sensor for an image sensor array, the column sensor comprising a plurality of pixel sensors, each pixel sensor comprising:

a modulator of a delta-sigma converter, the modulator configured to be in communication with a detector and configured to sample an analogue signal received from a detector at a particular sampling rate, the modulator further configured to provide a bit stream of a particular bit rate, such a bit stream corresponding to a sampled analogue signal; and wherein the column sensor comprises a decimator of a delta-sigma converter, the decimator in communication with the modulators of the pixel sensors, the decimator configured to receive and modify serially each bit stream from the one or more modulators in order to provide a digital output signal.

The decimator may be configured in a similar manner to the decimator of a pixel sensor converter of the first aspect. The bit stream from each pixel sensor of the column sensor may be multiplexed for communicating with the decimator.

According to a seventh aspect of the invention there is provided a converter for use with a detector, the delta-sigma converter provided on a semiconductor die, wherein the die comprises circuitry for a modulator, circuitry for a decimator, and capacitors for use with at least one of the modulator and decimator, the die being layered such that the capacitors partially or fully overlap with the circuitry for the decimator or the circuitry for the modulator.

The modulator, or parts of the modulator, may be implemented using PMOS circuitry. The modulator, or parts of the modulator, may be implemented using NMOS circuitry. The decimator, or parts of the decimator, may be implemented using PMOS circuitry. The decimator, or parts of the decimator, may be implemented using NMOS circuitry.

According to an eighth aspect of the invention there is provided a method for converting an analogue signal to a digital output signal in a pixel sensor; the method comprising:

sampling an analogue signal received from a detector at a particular sampling rate using a modulator of a delta-sigma converter, and providing a bit stream of a particular bit rate, the bit stream corresponding to the sampled analogue signal; and modify the bit stream provided from the modulator using a decimator of a delta-sigma converter and providing a digital output signal, the digital output signal representative of the analogue signal received at the modulator, but having a reduced bit rate than the bit stream provided by the modulator.

According to a ninth aspect of the invention there is provided a method of providing for a digital output signal of a pixel sensor, the pixel sensor comprising a decimator configured to provide finite impulse response filtering of a bit stream from a modulator, the method comprising:

using a sampling rate associated with the modulator of the pixel sensor in order to determine one or more finite impulse response coefficients;

communicating the one or more coefficients to the decimator in order to allow for providing of a digital output signal.

The method may comprise communicating the coefficients to more than one pixel sensor. The method may comprise communicating the same coefficients to each pixel sensor in a column, or pixel sensor in an image sensor array.

According to a tenth aspect of the invention there is provided an apparatus for providing for a digital output signal of a pixel sensor, such a pixel sensor comprising a decimator configured to provide finite impulse response filtering of a bit stream from a modulator, the apparatus configured to use a sampling rate associated with a modulator of a pixel sensor and to determine one or more finite impulse response coefficients; the apparatus further configured to communicate one or more determined coefficients to a decimator of a pixel sensor in order to allow for providing of a digital output signal.

The apparatus may be configured to communicate one or more determined coefficients to more than one pixel sensor. The apparatus may be configured to communicate the same coefficients to each pixel sensor in a column, or pixel sensor in an image sensor array.

According to an eleventh aspect there is provided a computer program stored, or storable, on a computer readable medium, the computer program configured to provide the method of any of the features of the eighth or ninth aspects.

According to a twelfth aspect of the invention there is provided a pixel sensor for an image sensor array, the pixel sensor comprising:

a detector configured to convert a detected signal to an analogue signal an analogue-to-digital converter in communication with the detector and configured to convert the analogue signal to a sampled signal, the sampled signal representative of the analogue signal having been sampled at a digitising sampling frequency to provide a particular bit rate; and a down-sampler, the down-sampler in communication with the analogue-to-digital converter, and configured to provide a digital signal, the digital signal representative of the sampled signal, but having a reduced bit rate.

According to a thirteenth aspect of the invention there is provided a decimator for an image sensor array, the decimator comprising:

an accumulator configured to modify bits associated with a bit stream received from a modulator at a particular bit rate, the accumulator comprising one or more 1-bit registers, the 1-bit registers configured to serially modify bits so as to provide a digital output signal, such a digital output signal representative of a received bit stream, but having a reduced bit rate.

The accumulator may comprise a 1-bit register and a 1-bit adder. The accumulator may be configured to add together bits associated with a received bit stream. The accumulator may be considered to add the bits one bit at a time.

The accumulator may further comprise a shift register. The shift register may be configured to store the sum of bits added. The size of the shift register may be commensurate with the desired signal-to-noise ratio of the pixel sensor converter. The output from the shift register may provide the digital output signal of the pixel sensor converter. The accumulator may comprise one or more pulsed latches. The accumulator may comprise one or more D-type flip flops. The accumulator may be realised using one or more D-type flip flops. The D-type flip flop may use two pulsed latches. The accumulator may be realised using one or more pulsed latches.

The decimator may be configured to filter bits associated with a bit stream in order to provide a filtered bit stream. The decimator may be configured to filter a bit stream received from the modulator, wherein the filtered bits are providable to the accumulator. The decimator may be configured to filter a bit stream digitally. The decimator may be configured to act as a finite impulse response filter in order to provide a digital output signal. The impulse response may have a parabolic shape.

Coefficients for the finite impulse response filter may be associated with the sampling rate of the modulator. Coefficients may be determined from the sampling rate of the modulator. The pixel sensor converter may be configured to receive coefficients for use in the decimator, such as receive from further circuitry, such as processing circuitry or the like.

According to a fourteenth aspect of the invention there is provided a pixel means for an image sensor array, the pixel means comprising:

a means for converting comprising a means for modulating and a means for decimating; wherein the means for modulating is configured to be in communication with a means for detecting a signal and providing an analogue signal, the means for modulating configured to sample a received analogue signal at a particular sampling rate and to provide a bit stream of a particular bit rate, such a bit stream corresponding to a sampled analogue signal; and wherein the means for decimating is in communication with the means for modulating, and is configured to receive and modify a bit stream in order to provide a digital output signal, such a digital output signal representative of an analogue signal, but having a reduced bit rate than a received bit stream.

The invention includes one or more corresponding aspects, embodiments or features in isolation or in various combinations whether or not specifically stated (including claimed) in that combination or in isolation. Corresponding means for performing one or more of the discussed functions are also within the present disclosure. One or more embodiments/aspects may be useful when providing a pixel sensor for an image sensor array.

The above summary is intended to be merely exemplary and non-limiting.

BRIEF DESCRIPTION OF THE FIGURES

A description is now given, by way of example only, with reference to the accompanying drawings, in which:—

FIG. 1a shows an embodiment of a pixel sensor comprising a pixel sensor converter and a detector; and FIG. 1b shows an embodiment of the pixel sensor in which the detector comprises a plurality of detector elements;

FIG. 2 shows an embodiment of an image sensor, comprising an image sensor array having a plurality of pixel sensors as shown in FIG. 1;

FIG. 7 shows a semiconductor die layout of a pixel sensor converter;

FIG. 10 shows an exemplary comparator for use with a modulator of FIG. 8.

DESCRIPTION OF SPECIFIC EMBODIMENTS

Figure 3:
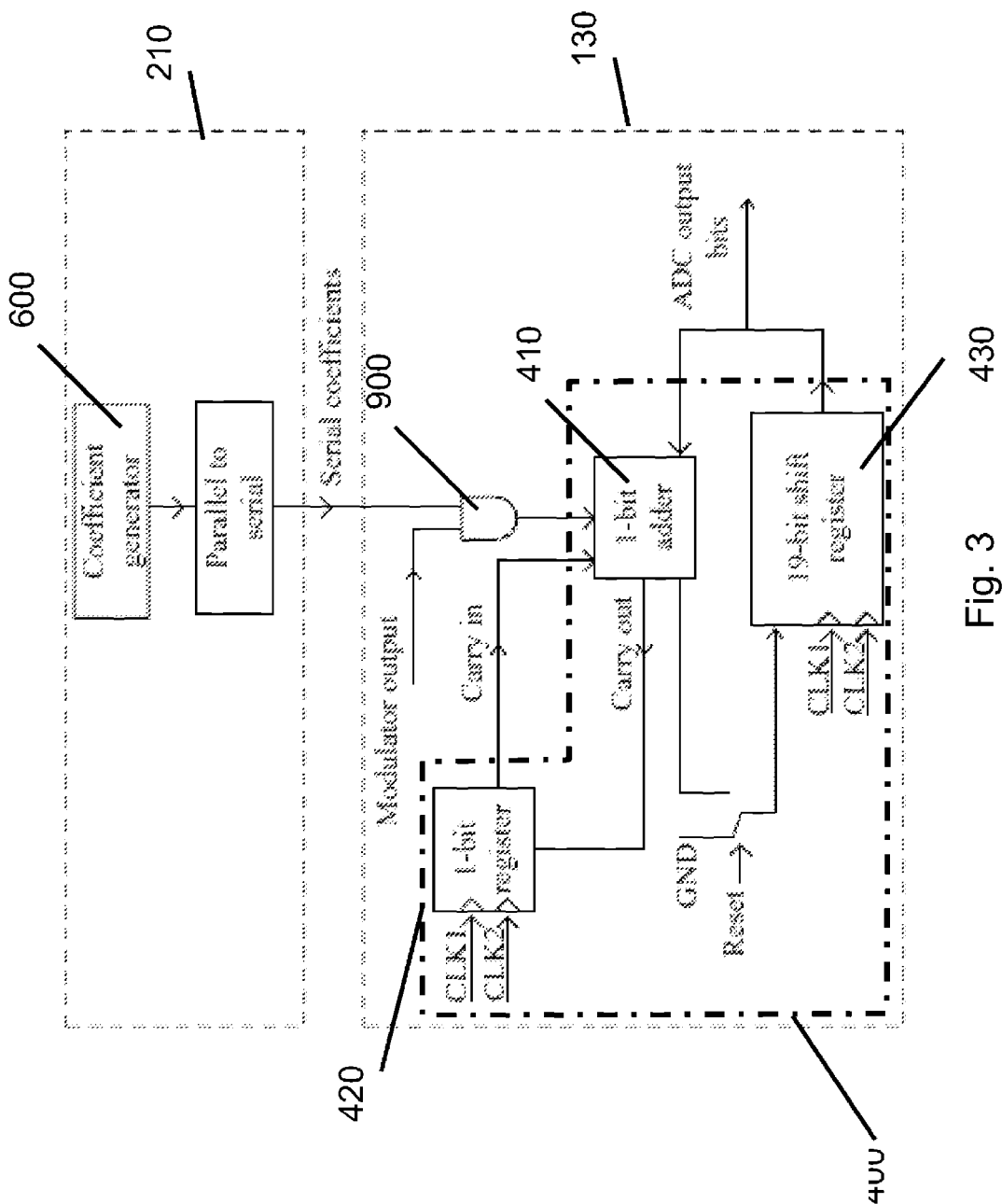
FIG. 3 shows a circuit diagram of a decimator for a pixel sensor converter as shown in FIG. 1, including further processing circuitry for providing coefficients to the decimator.

FIG. 1a shows a simplified block diagram of a pixel sensor converter 100 according to an embodiment of the invention. The pixel sensor converter 100 comprises a modulator 120, and a decimator 130. The pixel sensor converter 100 is in communication with a detector 110, which in the present embodiment is a photo-detector, such as a photodiode with or without a load transistor, or the like.

The modulator 120 and decimator 130 are configured as a delta-sigma converter. The pixel sensor converter 100 and the detector 110 can be considered to provide a pixel sensor 160.

In the present embodiment, the detector 110 is provided by a logarithmic detector. However, in alternative embodiments, the detector 110 may be an alternative non-linear sensor, or may be a linear sensor, which includes time-based linear sensors.

Here, detector 110 is configured to receive a detected signal (e.g. an optical signal), and convert this to an analogue signal. The analogue signal is an electric analogue signal, such as an analogue voltage representative of the detected signal, which is then provided to the modulator 120. The modulator 120, using delta-sigma principles, samples a received analogue signal at a particular sampling rate and provides a bit stream that is representative of the analogue signal. Using delta-sigma principles, the sampling rate is often in excess of the Nyquist sampling rate, thus can be defined as ratio of the sampling rate with respect to the Nyquist sampling rate (or so-called over sampling ratio (OSR)).

The bit stream output from the modulator 120 is the same bit rate as provided by the oversampling ratio times the Nyquist sampling rate. It can be considered to have a number of bits associated with a particular frame captured by the modulator 120. That is to say that the bit stream output comprises a plurality of frames, each frame having a plurality of bits. The bits of each frame correspond to one intended sample of the photo-detector (even though the bit rate output will be higher).

The bit stream output from the modulator 120 is then communicated to the decimator 130, which serves to modify the bit stream so as to provide a digital signal output. Here, the modified bit stream can be considered to have been filtered to remove some quantisation errors and some analogue noise. The modified bit stream can also be considered to have been down-sampled to reduce the bit rate, when compared to the bit rate being provided from the modulator 120.

FIG. 1b shows a further embodiment of the pixel sensor converter 100 comprising a modulator 120, and a decimator 130. Here, the detector 110 is provided by three detector elements 100a, 110b, 110c. Each detector element 110a, 110b, 110c is configured to detect a different type of signal. For example, each detector element may be configured to detect a different colour of light, when the converter is to be implemented in a colour image array. Of course, in other examples, each element may be configured to detect a different bandwidth of electromagnetic signal, different acoustic frequency, etc.

It will be appreciated that the output of each detector element 110a, 110b, 100c may be multiplexed in order to provide to the input of the modulator 120.

Similarly, it will be appreciated that the detector 110 may be configured to detect electromagnetic wave signals from any band of the electromagnetic spectrum, including but not limited to the millimeter wave, infrared, terahertz, visible, ultraviolet, X-ray, and gamma ray bands. Also, the detector 110 may be a pressure detector. For example, the detector 110 may be an ultrasonic detector, which may be configured for use with an ultrasonic image sensor. Likewise, the detector 110 may be a chemical detector. For example, the detector 110 may be an olfactory detector.

FIG. 2 shows an image sensor 200 comprising a plurality of pixel sensors 160, Here, the pixel sensors 160 can be considered to be provided as an image sensor array 150. The image sensor 200 further comprises a processing circuitry 210, comprising a processor 220 and memory 230 configured in a known manner (e.g. provided by a field programmable gate array, application specific integrated circuit, or the like).

The processing circuitry 210 is in communication with each pixel sensor 160 and is configured to read a digital output signal. In this example, the processing circuitry 210 is further in communication with each pixel sensor converter 100 in order to provide filtering coefficients, as will be described.

FIG. 3 shows an exemplary embodiment of the decimator 130, as shown generally in FIGS. 1 and 2. As is shown, the decimator 130 is in communication with the modulator 120 and is configured to receive the bit stream provided by the modulator 120. As discussed, the decimator 130 filters quantization and other noise from the modulator output. Additionally, the decimator 130 down-samples the output to a lower bit rate, which generally (but not always) is the Nyquist rate.

In this example, the decimator 130 is configured as a finite impulse response filter, or an oversampling ratio tap finite impulse response filter. While it would be possible to determine coefficients for the finite impulse response filter at the decimator 130 (e.g. by providing processing circuitry at the decimator 130), in this example, the decimator 130 is in communication with further apparatus (such as processing circuitry 210 of FIG. 2, or the like) to receive coefficients for the filter.

It will be appreciated that by providing the coefficients from the processing circuitry, the decimator 130 can be provided with a small area. Similarly, although coefficients could be provided at the decimator (e.g. firmware, hardware, software), it may be the case that changing the coefficients (e.g. when the oversampling ratio changes), might be easier at the processing circuitry 210.

Here, the decimator 130 is configured as a finite impulse response filter for a first-order modulator 120. In this case, the decimator 130 is configured as a parabolic finite impulse response filter according to the following:

$$h_{dec}[n] = \begin{cases} h[n]/S, & 0 \le n \le OSR - 1 \\ 0, & \text{otherwise} \end{cases}$$

where $$h[n] = OSR + n(OSR - 1) - n^2$$

and $$S = \frac{OSR(OSR + 1)(OSR + 2)}{6},$$

where, OSR is the oversampling ratio, discussed above.

Of course, a different filter may be used, such as a filter with a k-tap duration for the first-order modulator having a different impulse response shape, e.g. a triangular shape. However, for a discrete-input delta-sigma pixel sensor converter 100, distortion may be avoided, or at least reduced/lessened, if decimation is done with a one-stage oversampling ratio-tap finite impulse response filter. Briefly, the reason there is no or little distortion is as follows.

The analogue portion of the pixel sensor 100 outputs the input signal plus the shaped quantization noise. Since the input signal of the pixel sensor converter 100 may be constant for a number of samples corresponding to the oversampling ratio, the output of an oversampling ratio-tap decimation filter is associated with one sample of the input. While filtering the quantization noise, such a decimator 130 at worst multiplies the input signal by a gain. If the sum of the impulse response coefficients for the decimator 130 equals one then the gain of the filter would also be one for the input signal. If the filter has more than the oversampling ratio number of taps, distortion might appear and it may limit the output signal-to-noise ratio.

Figure 5:
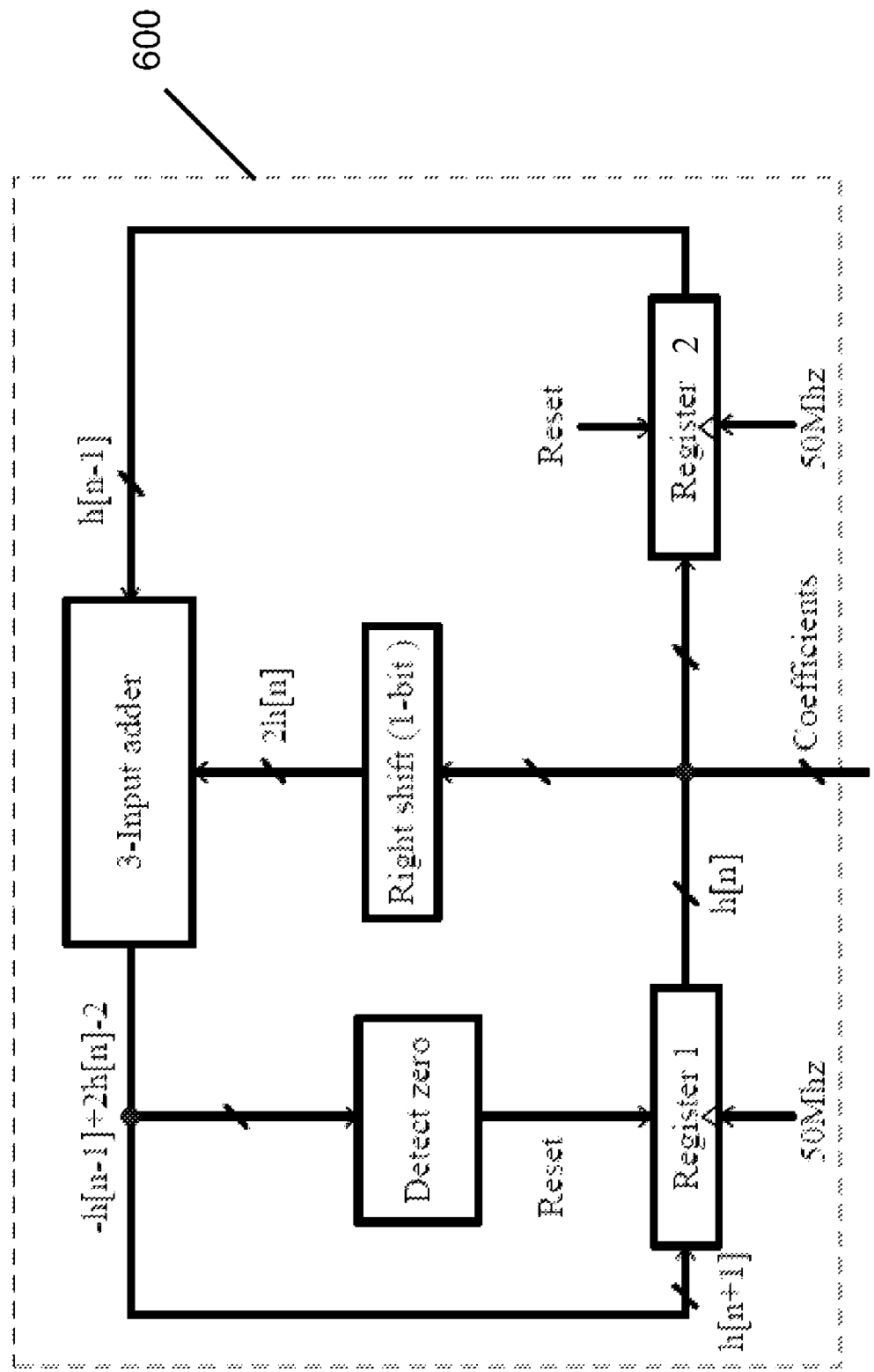
FIG. 5 shows an exemplary recursive logic circuit for providing coefficients as in FIG. 3.

FIG. 5 shows a schematic of a recursive logic circuit for providing coefficients to the decimator of FIG. 3. The coefficients of the filter are generated by the processing circuitry 210 of FIG. 2. The de-normalized coefficients h[n] follow from the recurrence:

$$h[n+1] = -h[n-1] + 2h[n] - 2$$

Registers 1 and 2 store h[n] and h[n−1] and are initialized to the oversampling rate and zero. After one Nyquist interval of oversampling ratio samples, h[n+1] will be zero according to the recurrence. Thus, zero detection may be used to create a reset signal. Registers 1 and 2 will be reset to the oversampling ratio and zero and the next Nyquist interval will begin. Therefore, no separate reset signal or counter is needed for the decimator 130. The output coefficients are fed serially to the decimator 130.

In this example, the decimator 130 of the pixel sensor converter 100 comprises an AND gate 900 (or equivalent). The bit stream of the output from the modulator 120 is ANDed with the coefficients provided by the recursive logic circuit. Because of the nature of the filter, each frame bit is ANDed with all coefficients until all the bits in a particular frame of the bit stream have been ANDed. The output of the AND gate 900 therefore provides a filtered output, which in this example is a series of filtered bits. Therefore, the AND gate 900 (or equivalent) implements the multiplication part of a finite impulse response filter. This comprises two parts: multiplications of bits of the bit stream with coefficients; and cumulative addition (accumulation) of the results of such multiplications. By providing the AND in such a manner, a very efficient multiplication part of a finite impulse response can be provided.

The decimator 130 further comprises an accumulator 400 (which in this example, excludes AND gate 900). The accumulator comprises a 1-bit adder 410 and a 1-bit register 420. The register 420 and adder 410 are in communication so as to receive the filtered output from the AND gate 900, and thus to add all the filtered bits corresponding to a particular frame together; the 1-bit register 420 stores the output carry of the adder 430. The accumulator 400 further comprises a shift register 430, configured to store the accumulator 400 data and to permit bit serial addition. When a complete frame has been processed by the AND gate 900 and accumulator 400, the value of the shift register 430 is output as a digital output signal. Such a digital output signal may be communicated to further apparatus, or to further processing circuitry 210 in order for this to be stored on memory, or to be processed or the like.

In this example, 10 bits are used to represent the coefficients. It will be appreciated that in such an embodiment, 19 bits are used to store the value of the accumulator without overflowing (as is exemplified by the 19-bit shift register shown in FIG. 3a). Of course, this is shown by way of an example, and can be considered to be based on the desired signal-to-noise ratio. If a lower signal-to-noise was desired or required, then a smaller shift register could be provided, and vice versa.

Figure 4:
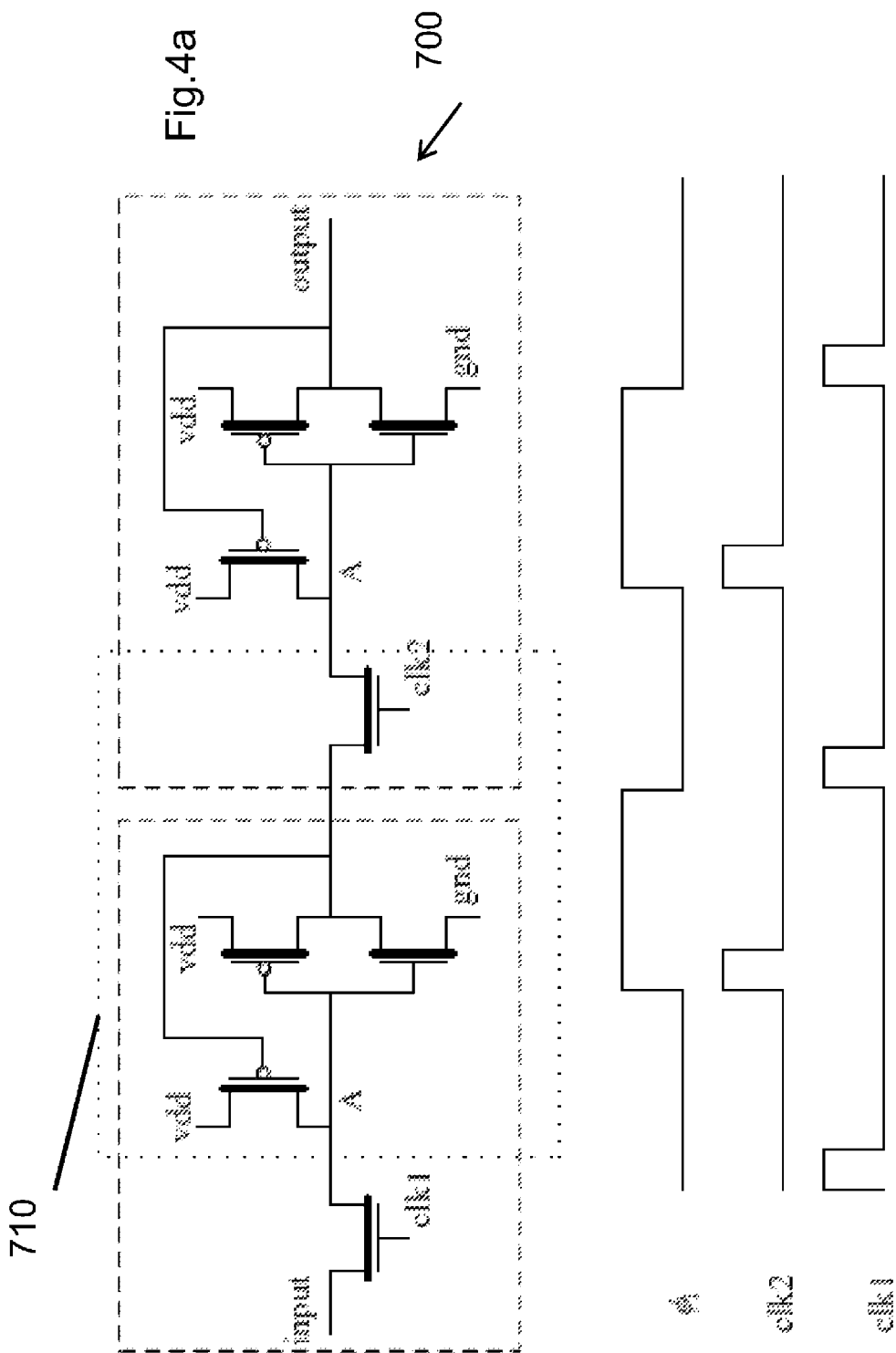
FIG. 4 shows an exemplary D-type flip flop for use in the decimator of FIG. 3.

It will also be noticed, that because the accumulator 400 is configured so as to provide serial processing, then providing a sufficiently large shift register 430 would allow a user to modify the desired signal-to-noise ratio without having to adapt, or change the architecture of the pixel sensor converter 100. For example, it is possible to increase the frame rate at the expense of signal-to-noise ratio with the same architecture, and vice versa In order to reduce the size of the decimator 130, FIG. 4a shows a modified D-type flip flop which can be used to implement the registers of FIG. 3. FIG. 4b shows an exemplary clock diagram. By using two pulsed latches, a D flip-flop with only eight transistors can be provided. A register 410, 420, 430, which is made up of one D flip flop or multiple D flip flops in series, may be divided into identical blocks, one of which is outlined by dots in FIG. 4a, shown at 710. Since each transistor in the block 710 has its source or drain shared with another transistor of the same type, the block 710 may be laid out compactly (e.g. with an area of 2.4 µm² per transistor). A register 410, 420, 430 may be viewed as one or more pulsed latches in series. The embodiment described here results in one bit of storage for two pulsed latches. This does not preclude other arrangements of pulsed latches into bits of storage.

Here, the pulsed latches are driven by two non-overlapped clocks, as exemplified in FIG. 4b. These clocks may be generated from the rising and falling edges of a main clock. As shown in FIG. 4a, a transistor, which in this case is a PMOS transistor, connects the inverter output to its input. Therefore, when the latch output is at gnd volts, node A will be stable and connected to node $v_{dd}$. But when the latch output is at $v_{dd}$ volts, node A will be in a high impedance state that is initially discharged to ground. During the time that the input switch is off, this node will gradually charge up to $v_{dd}$ volts. Circuit simulation shows that it takes at least 150 µs to lose the data in the latch. Since the input clock is 1 MHz in this example, there is a negligible probability of bit error. However, the circuit is still susceptible to noise. To reduce the noise vulnerability of the circuit, switches are turned on as long as possible without having any overlap between the pulses. The embodiment described here uses two non-overlapped clocks. This does not preclude other arrangements of pulsed latches with other than two non-overlapped clocks.

In such an arrangement a compact decimator for a pixel sensor converter can be realised. Because of the reduction of complexity, the power consumption of the decimator is also low.

It will be appreciated that the recursive logic circuit of FIG. 5 may be used to provide more than one pixel sensor converter with coefficients. In one embodiment, the recursive logic circuit is used to provide more than one pixel sensor converter 100 of an image sensor array with coefficients. In some examples, the same coefficients are provided to all pixel sensors 100 in a pixel sensor array for use with the decimators 130 of those pixel sensors.

Figure 6B:
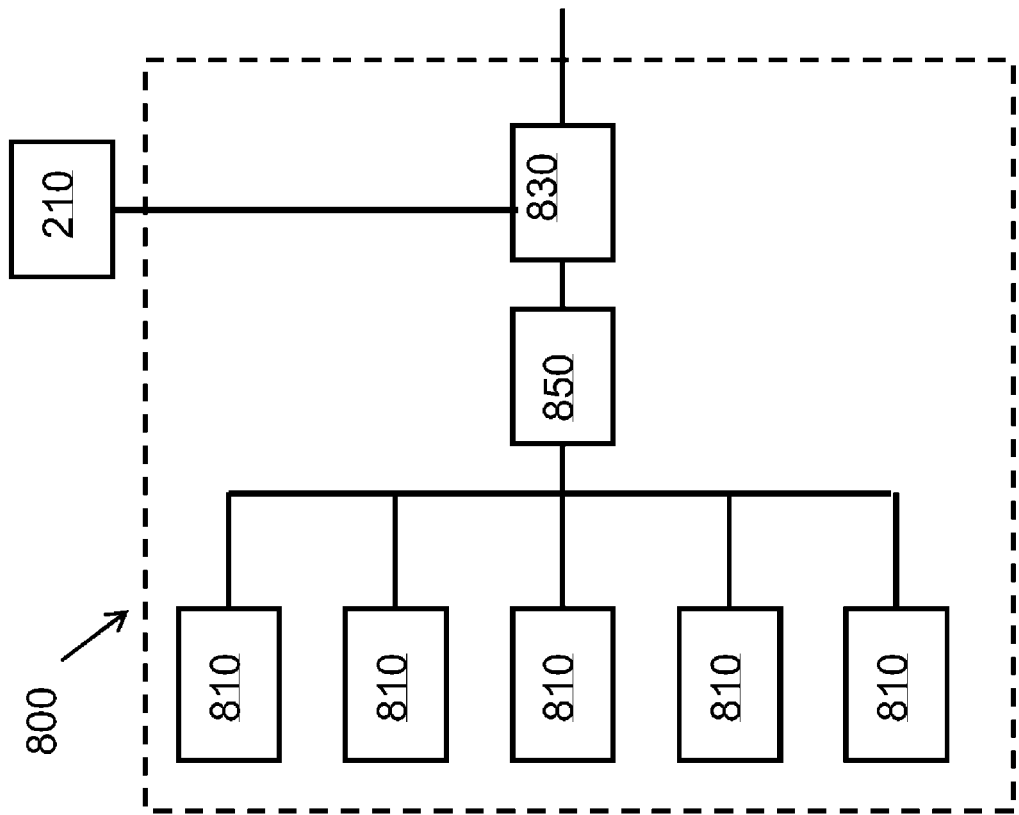
FIG. 6 shows a column sensor comprising the decimator of FIG. 3.
Figure 6A:
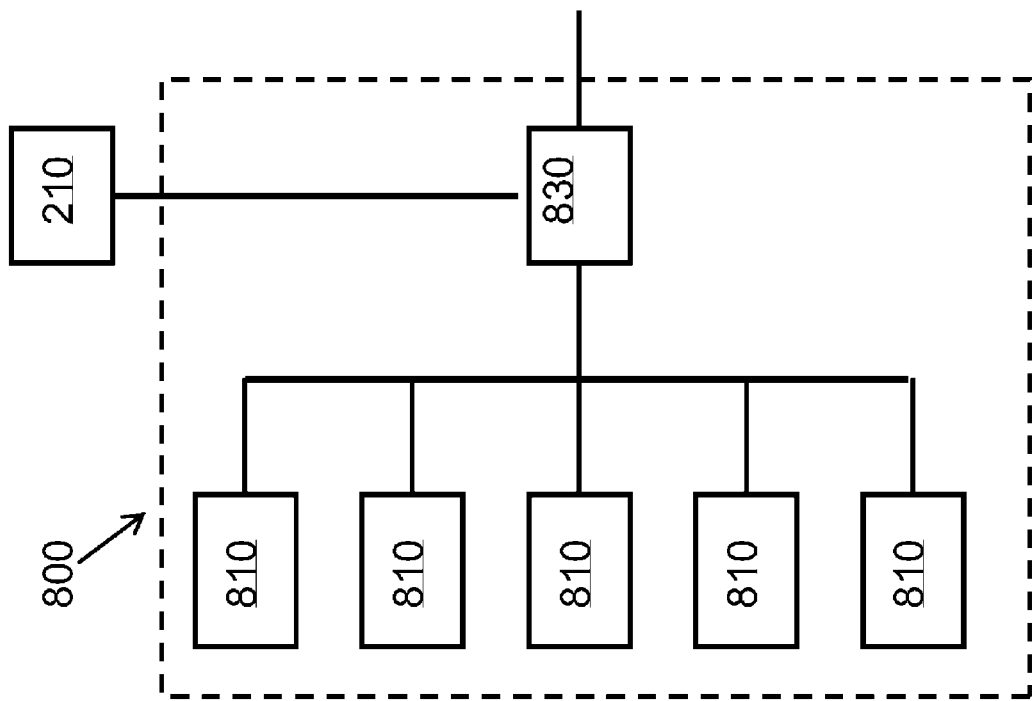

FIG. 6a shows a column sensor 800 comprising a plurality of pixel sensors 810. In this example, each pixel sensor 810 is provided with a photo-detector and a modulator (not shown). However, the output bit stream for each modulator is communicated to a decimator 830 to provide a digital output signal. In this example, the same (or similar) architecture as proposed in FIG. 3 is used. That is to say that the decimator is configured to receive coefficients from the processing circuitry 210, and to process the bits streams serially. It will readily be appreciated in some instances, the bits streams may be multiplexed with a multiplexer 850 before being modified by the decimator 830. This is shown in FIG. 6b.

It will be appreciated that, although not shown, each pixel sensor may comprise a plurality of detector elements 110a, 110b, 110c, in a similar manner to that described in relation to FIG. 1b.

FIG. 7a shows an exemplary diagram of a layout for a pixel sensor converter 100 on a die 500a (i.e. a semiconductor die). The die comprises a modulator layout 510a, a decimator layout 520a, and a capacitor layout 530a. The capacitor layout 530a comprises capacitors for use with the modulator 120 (e.g. sampling capacitors, and integration capacitors).

As shown in FIG. 7a in this example, the capacitor layout 530a accounts for over ten percent of the area of the die 500a. To satisfy well-known design rules, no transistors have been put under the capacitor layout 530a. This teaching exists to decrease variability in the capacitances, as well as to decrease coupled noise.

FIG. 7b shows an embodiment of a similar die layout 510b for the pixel sensor converter 100. Again, the die layout comprises a modulator layout 510b, decimator layout 520b, and capacitor layout 530b, in a similar manner to that described above. However, in this example, the capacitor layout 530b is provided such that it overlaps with the decimator layout 520b. That is to say, transistors are placed underneath the capacitor layout 530b.

Providing a pixel sensor converter 100 that is not sensitive to capacitor mismatch and that filters noise effectively, allows for the well known rule to be broken. Part of the decimator may be put underneath the capacitors, which belong to the modulator, reducing the overall area significantly. Alternately, other parts of the modulator may be put underneath the capacitors, or part of the decimator and other parts of the modulator may be put underneath the capacitors. Such a configuration allows for a pixel sensor converter of reduced size to be provided.

Figure 8A:
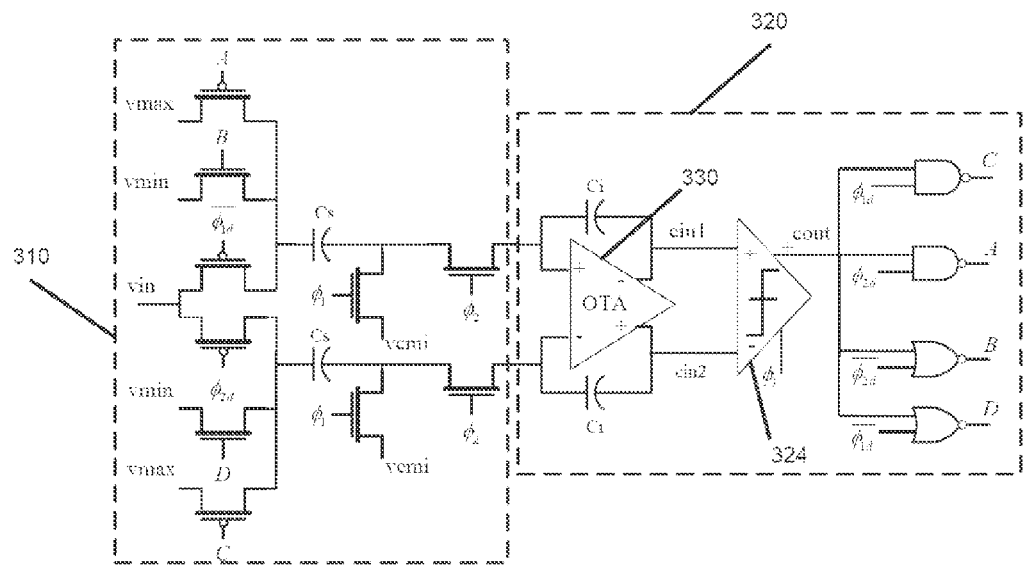
FIG. 8A shows an exemplary modulator, which may be used with a pixel sensor converter.

FIG. 8A shows a modulator 120 according to an embodiment of the invention. Here, the modulator 120 comprises an input 310 configured to be in communication with the detector 110. The input 310 receives the analogue signal at $V_{in}$, generally provided as some level of voltage based on the amount of signal (e.g. light, pressure, etc.) to which the detector 110 has been exposed. The input 310 samples the signal using sampling capacitors, $C_s$. The modulator 120 comprises an integrator-and-comparator 320 in communication with the input 310. The integrator-and-comparator 320 comprises an operational transconductance amplifier 330, having integrating capacitors, $C_i$, the combination of which is called an integrator. The integrator-and-comparator 320 further comprises a comparator 324 in communication with the integrator, and configured to provide a bit stream output. The bit stream output of the comparator 324 is fed back to the input 310 through clocked logic gates. These clocked logic gates control the sampling of reference voltages $V_{max}$ and $V_{min}$, which are subtracted from $V_{in}$ according to delta-sigma modulation principles. It will be appreciated that the input 310, operational transconductance amplifier 330, and integrating capacitors, $C_i$, together may be considered to provide the differencing and integrating functions of delta-sigma modulation.

As discussed above, the modulator 120 is configured to sample the analogue signal at a particular sampling rate above the Nyquist rate. The modulator 120 quantizes the analogue signal coarsely. In the present example, one-bit quantization is used. Of course, other quantization may be used in different embodiments. Such sampling moves some or most of the quantization noise outside the Nyquist band. This may be considered as noise shaping.

The modulator 120 is configured to have a switched-capacitor design. A differential architecture is used since it can reject the common-mode noise in the circuit. Since the photo-detector 110 may be considered as having a single ended output, a modulator 120 with a single input 310 is shown. Here, the modulator 120 is a first-order modulator, and therefore uses a higher over sampling ratio, when compared to higher order modulators. This provides a simplified circuit, which also minimised area usage. In addition, because of the higher oversampling ratio, more introduced errors (such as kTC noise, or mismatch issues with capacitances) may be filtered during decimation. This may allow for smaller capacitors ($C_s$, $C_i$) to be provided with the modulator 120, when compared to higher order modulators. This again reduced area.

The first-order modulator 120 may be less sensitive to any gain error due to capacitor mismatch. This can be helpful, but not essential, for the proposed die layout of FIG. 7b. Higher-order modulators may be used, but gain error due to capacitor mismatch may degrade the signal-to-noise ratio. The integrator output in a first-order modulator drives a quantizer, which is implemented here using a comparator 324. For single-bit quantization (chosen for possible linearity and compactness), most gain error will have negligible effect on the signal-to-noise ratio. By providing a first-order modulator 120, the pixel sensor converter 100 will tolerate more capacitance mismatch and, therefore, smaller capacitors may be used to decrease the power consumption and area usage substantially.

To derive the specifications for the modulator 120, a threshold for input-referred noise is defined based on the required signal-to-noise ratio. The effect of a nonideality can be modelled as an input noise and circuit parameters are designed so that the noise contribution does not exceed the defined threshold.

The threshold noise calculation can be determined as follows. The output signal of a modulator 120 is equal to its input signal (i.e. the analogue signal) plus filtered quantization noise. Assuming that the analogue noise at the modulator input 310 is white with power $P_n$ and that it overpowers the quantization noise at the pixel sensor converter 100 output, then the noise power at the decimator 130 output $P_{n\text{-}dec}$, which determines the signal-to-noise ratio, may depend on a (causal) decimation filter $h_{dec}[n]$ according to Parseval's theorem:

$$P_{n-dec} = P_n \sum_{n=0}^{\infty} |h_{dec}[n]|^2.$$

As described, the decimator 130 is configured as a finite impulse response filter for the first-order modulator 120. In this case, the decimator 130 is configured as a parabolic finite impulse response filter, i.e.

$$h_{dec}[n] = \begin{cases} h[n]/S, & 0 \le n \le OSR - 1 \\ 0, & \text{otherwise} \end{cases}$$

It can be shown that the output noise of the pixel sensor converter 100 can be approximated by:

$$P_{n-dec} = \frac{6P_n}{5OSR}$$

Therefore, the signal-to-noise ratio (SNR) at the output of the pixel sensor converter 100 can be shown to be:

$$SNR = \frac{P_s}{P_{n-dec}} = \frac{5P_s OSR}{6P_n}.$$

where $P_s$ is the signal power.

Consider a frame rate of the pixel sensor converter 100 (or image sensor array 200) to be 50 Hz. In such case, consider an oversampling ratio of 1000, assuming a uniformly-distributed signal over a 0.7 V range in each input branch. In such an example, the input-referred noise $P_n$ would helpfully be less than $1.36 \times 10^{-5}$ V$^2$ to achieve a signal-to-noise ratio of 70 dB. Given that there are multiple uncorrelated noise sources that can be referred to the operational transconductance amplifier 330 input (switching noise, charge injection, clock feedthrough etc.), the power of each, in some examples, may be less than one fifth of this value, which is $2.72 \times 10^{-6}$ V$^2$, which then meets the specifications. In such a manner, noise sources can be referred to the input and compared to this threshold.

Specification of the modulator 120 includes selecting or setting one or more of: the integrating capacitor $C_i$, sampling capacitor $C_s$, integrator gain g, peak-to-peak range of the operational transconductance amplifier 330 output $V_{o\text{-}pp}$, unity gain bandwidth (UGB) and slew rate (SLR) of the operational transconductance amplifier 330, time-constant of the integrator τ, and current in the operational transconductance amplifier 330 branches, I. In the first order modulator 120, the output range of the integrator in 320 with unity gain is twice the input range of the modulator 120. The gain is also a capacitance ratio, i.e.

$$g = \frac{C_s}{C_i} = \frac{V_{o-pp}}{2V_{i-pp}}.$$

Assuming a single dominant pole for the operational transconductance amplifier 330, and assuming that the operational transconductance amplifier 330 is not slewing, the time constant of the integrator in 320 when responding to a step input is given by:

$$\tau \approx \frac{1}{\omega}\left(1 + \frac{C_s}{C_i}\right)$$

where ω is the unity gain bandwidth of the operational transconductance amplifier 330. The minimum required slew rate of the operational transconductance amplifier 330 is given by:

$$SLR = \frac{I}{C_i} > \frac{1.1V_{o-pp}}{2T}$$

where T is the integration time. Assuming that the operational transconductance amplifier 330 has a single dominant pole, then to provide no (or insignificant) slewing at the operational transconductance amplifier 330 output, the slew rate should be chosen greater than the maximum possible slope, which is $V_{o\text{-}pp}/2\tau$. But providing the operational transconductance amplifier 330 with no slewing may mean that a high current for the operational transconductance amplifier 330 is provided. In which case, this may lead to a much higher unity gain bandwidth for the operational transconductance amplifier 330, which may not be required. One solution is to have slewing at the operational transconductance amplifier 330 output which is compensated by a reasonable unity gain bandwidth and a corresponding τ.

The first-order structure is not necessarily sensitive to capacitance mismatch and the resulting gain error. The minimum value for the capacitors in the integrator in 320 can therefore be determined by kTC noise. Assuming that kTC noise from different capacitors are uncorrelated, the total kTC noise power referred to the input can be shown to be related to:

$$P_{n-kTC} = \frac{2kT}{C_i g^2} + \frac{2kT}{gC_i}$$

The three previous equations show that the integrator in 320 gain can be chosen based on one or more of: the input-referred noise, slew rate and dynamic range of the operational transconductance amplifier 330. A smaller gain would result in more input-referred noise. Also, a higher gain may increase the provided slew rate and dynamic range of the operational transconductance amplifier 330. Considering a maximum-achievable dynamic range, with high enough gain in a CMOS 0.18 μm process, of around 0.6V, a gain of ⅓ may be used to meet both of the constraints. Therefore, the total kTC noise is $$P_{n-kTC} = \frac{24kT}{C_i}$$

As discussed above in the example in which the oversampling ratio was 1000, it would be helpful if the total kTC noise was less than $2.72 \times 10^{-6}$ V². In which case (and by way of an example only), the minimum value for the integrating capacitor $C_i$ would be 37 fF. Of course, it would be possible to select a higher value of integrating capacitor, such as 60 fF, or higher. This may provide a margin to account for any mismatch in the capacitors that would change the gain. A change in gain may affect the input-referred kTC noise power. In a similar manner, the size of sampling capacitor $C_s$ may be chosen (e.g. 20 fF in order to achieve a gain of ⅓ in the integrator in 320).

Assuming the integrator in 320 output is uniformly distributed in its range, the settling error at the integrator in 320 output would be uniformly distributed over $\pm(2 \times 0.7/3)e^{-t/\tau}$.

By referring the integrator in 320 output error to the input 310 and comparing it to the threshold noise, it can be suggested that the integration interval be roughly 6 times greater than the integrator time constant (e.g. at least 6.2, or the like). Following the example provided above, the integration interval is 7.5 ns so the time constant can be shown to be less than 1.21 ns. Considering the fact that switch resistances are generally not zero, the time constant, in this particular example, is chosen to be 0.9 ns. So the unity gain bandwidth of the operational transconductance amplifier 330 with no slewing can be derived to be 265 MHz.

In the example when the input signal range $V_{i-pp}$ is 0.7 V, $V_{o-pp}$ can be considered to be roughly 0.47 V. In which case, the slew rate may be between roughly 34.2 V/μs and 259 V/μs. Considering the example provided of the pixel sensor converter 100, a slew rate of 125 V/μs with a unity gain bandwidth of 300 MHz may be chosen for the operational transconductance amplifier 330 in order to provide the desired signal-to-noise ratio.

Of course, gain error in a first-order modulator 120, as described above, is not a serious problem. However, leakage can, in some cases, affect the signal-to-noise ratio. A finite DC gain of the operational transconductance amplifier 330 can introduce gain error, and leakage in the integrator in 320. Although gain error of the integrator in 320, in some cases, is not a problem, leakage can again affect the output signal-to-noise ratio.

Considering the above described example, a gain of at least 65 dB was proposed in order to provide a signal-to-noise ratio of 70 dB.

In some cases, when the overall DC gain of the operational transconductance amplifier 330 including nonlinearity is higher than the desired threshold (e.g. 65 dB), the performance will not degrade (or at least not degrade significantly). By way of an example, consider that a maximum of 15 dB reduction in gain due to nonlinearity exists, then a gain of 80 dB is used so as to be greater than a desired threshold.

Of course, thermal or flicker noise may also be present at the operational transconductance amplifier 330 input. The thermal noise of a long-channel MOS device can be modelled by a voltage source in series with the gate and having a power spectral density (PSD) of $$\overline{V_n^2} = \frac{4kT\gamma}{g_m}$$

where k is Boltzmann's constant and γ is ⅔ for a long-channel device. The flicker noise can also be modelled as a voltage source in series with the gate, with a PSD of about:

$$\overline{V_n^2} = \frac{K}{C_{ox}WL} \cdot \frac{1}{f}$$

where K is a process-dependent constant on the order of $10^{-25}$. Even using minimum-size transistors with an overdrive voltage of at least 0.2 V, one can provide that the thermal and flicker noise of input transistors in the operational transconductance amplifier 330 are much less than the threshold. In which case, they may not degrade the performance of the pixel sensor 100. Consequently, no correlated double-sampling circuit is needed to alleviate the flicker noise.

Nonidealities due to the switches are mostly nonlinear resistance, clock feedthrough and charge injection. A differential-mode integrator may attenuate the common-mode noise, thereby decreasing the effect of charge injection and clock feedthrough. In some cases, transistors may be provided to be large enough so that the nonlinearity of their on-resistance does not affect the settling behaviour.

Noise and distortion due to circuit nonidealities occurring after the integrator in 320 may be attenuated when referred back through the integrator in 320. Therefore the offset and hysteresis of the comparator 324 used to implement the one-bit quantizer may be widely tolerated. A comparator offset may change the signal range that is fed back in the delta-sigma loop to the integrator in 320. But as long as there is sufficient dynamic range at the integrator in 320 input, the comparator offset will not degrade the performance. This can be taken into account by adding a margin to the dynamic range. For example, in the embodiment described, a margin of 0.13 V margin may be added to the 0.47 V previously specified.

By way of an example above, it has been described that to achieve 80 dB of signal-to-noise ratio with a first-order modulator 120, an over sampling ratio of almost 1000 can be used. Considering when the Nyquist sampling rate of the pixel sensor 160 is 50 Hz (which may also be the frame rate of an image sensor 200, etc.). Since the sampling and integration periods are long, single transistors may be used instead of transmission gates. The sampling and integration capacitors are, as discussed, roughly 20 fF and 60 fF. Since the first-order pixel sensor 100 is tolerant to process variation and capacitor mismatch, a compact layout with a small area can be designed.

However, it will be appreciated that the oversampling ratio may be reduced, or increased (even using the same architecture). However but this may result in the signal-to-noise ratio decreasing and increasing respectively.

Figure 8B:
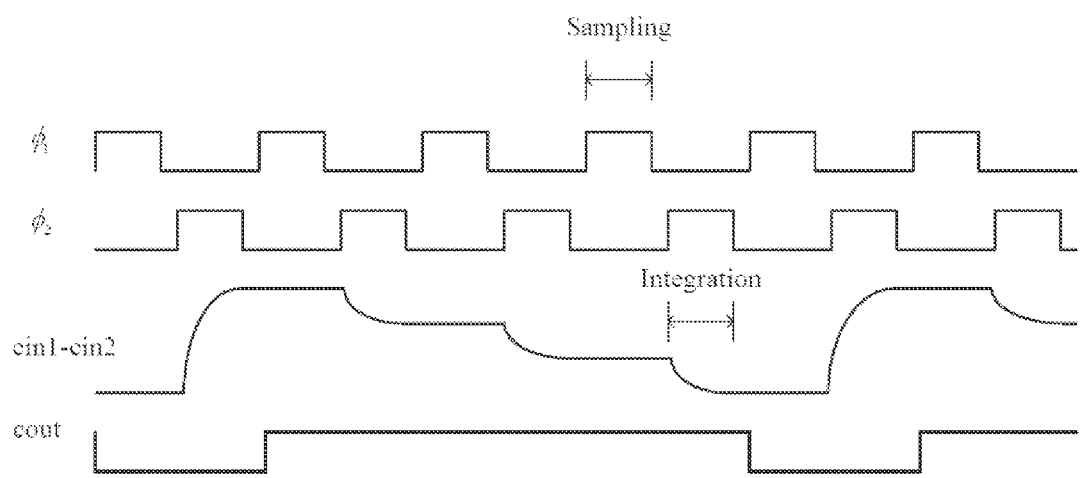
FIG. 8B shows a clock diagram.

FIG. 8B shows an example waveform from the modulator 120 when $V_{in}$ is close to $V_{max}$. The output is $C_{out}$.

Figure 9:
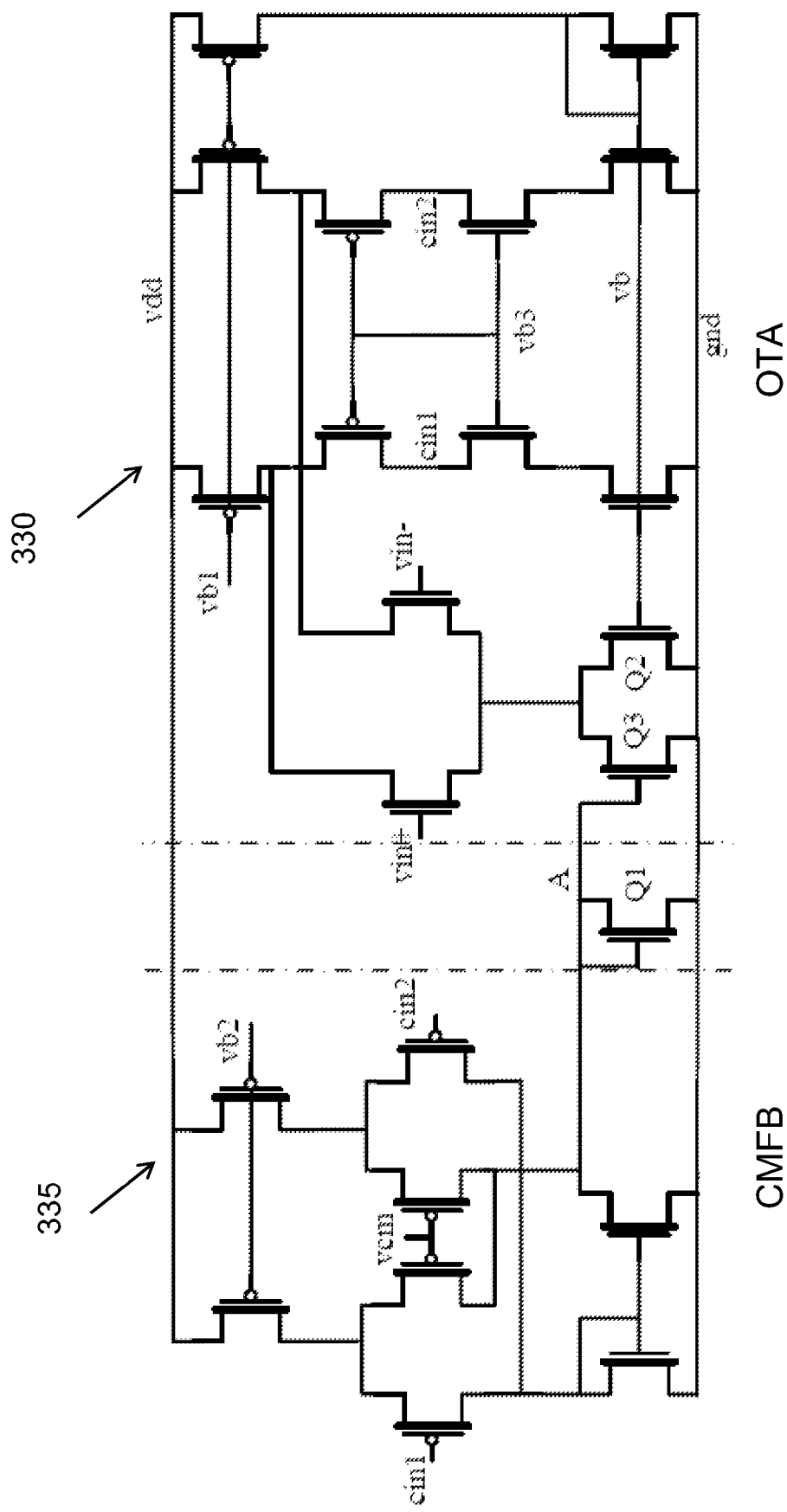
FIG. 9 shows an exemplary operational transconductance amplifier and common mode feedback circuit for use with a modulator of FIG. 8.

FIG. 9 shows a schematic of an exemplary operational transconductance amplifier 330 for use with the modulator 120 of the pixel sensor 100 and a differential-difference amplifier common-mode feedback (DDA-CMFB) circuit 335. Here, a folded-cascode design is shown for the operational transconductance amplifier 330. Since the operational transconductance amplifier 330 of FIG. 9 is biased in the subthreshold region, where the power consumption is very low, high gain is achieved. This is without the need for a gain boosting method, or the like. This reduces the area needed. The differential-difference amplifier common-mode feedback (DDA-CMFB) circuit 335 may be used to adjust the common-mode output of the operational transconductance amplifier 330. Using the common-mode feedback circuit, the operational transconductance amplifier outputs (Cin1, Cin2) are compared to the common mode voltage signal (VCM). Depending on whether the common mode of the operational transconductance amplifier 330 output is greater or smaller than the VCM signal, the voltage at the node A will be determined, and based on that, the current from the input branch of the operational transconductance amplifier 330 will be modified to set the operational transconductance amplifier 330 common mode output equal to the VCM.

Such a DDA-CMFB 335 has a smaller area compared to its switched capacitor equivalent, but may increase the nonlinearity of the operational transconductance amplifier 330 output. The operational transconductance amplifier 330 gain can be provided such that it is high enough to compensate for this nonlinearity. The table below gives exemplary specifications of the operational transconductance amplifier 330.

| Power consumption | 110 nW |
| Dynamic range | 0.6 V |
| DC gain | 80 dB |
| Slew rate | 65 V/ms |
| Load capacitance | 60 fF |
| Unity gain bandwidth | 290 kHz |
| Phase margin | 85° |

FIGS. 10a and 10b show an exemplary comparator 324 for use with the modulator 120 of the pixel sensor 100. The comparator 324 is composed of a modified regenerative latch (FIG. 10a) and an RS flip flop (FIG. 10b).

Here, the comparator 324 is provided as a modified regenerative latch comparator. The inputs of the comparator 324, Cin1 and Cin2, are configured to be in communication with the operational transconductance amplifier 330 outputs, Cin1 and Cin2 (see FIG. 9). The regenerative latch of the comparator 324 in this embodiment may be considered to have three branches 324a, 324b, 324c. Each branch 324a, 324b, 324c is in communication between the power supply rails, which in this example is $V_{dd}$ and Gnd. Here, the regenerative latch of the comparator 324 is provided with power limiters 326a, 326b, 326c. Hence, it is a modified regenerative latch. Each power limiter 326a, 326b, 326c is positioned on a branch, and configured so as to limit the maximum current on any particular branch 324a, 324b, 324c. One benefit of such a configuration is that it allows for the power consumption of the comparator 324 to be reduced, when compared to a comparator 324 without such power limiters. Here, the power limiters 326a, 326b, 326c are provided by transistors, but alternatives may be provided. The bias voltage of each power limiter transistor is derived from the operational transconductance amplifier 330.

In use, the modulator 120 is configured to receive at its input an analogue signal. The analogue signal is representative of an optical signal having been provided to the photodetector 110. Each pixel sensor will have a desired frame rate (e.g. 50 Hz, 100 Hz, etc.) and a Nyquist sampling rate. In addition, an oversampling ratio is set, which when multiplied to the Nyquist sampling rate gives the sampling rate of the modulator (it will be higher than the Nyquist sampling rate, e.g. 1000 times higher for the first-order modulator described).

The modulator is therefore sampling the analogue signal in excess of that required, and provides at its output the bit stream corresponding to the analogue signal. The bit stream comprises a series of bits, which, as discussed above, can be considered to be grouped in frames. This series of frame bits is provided to the decimator 130, which in this example operates serially.

The modulator 120 has been described as a single-input switched-capacitor modulator that does not use the photodiode capacitance as an integrator. Therefore, the proposed pixel sensor converter 100 is applicable for use with logarithmic sensors, where there is no integration capacitor.

The decimator 130, unlike previous designs, has been designed such that it may be implemented inside the pixel to reduce the output bit rate.

Pixel-level data conversion has several advantages. Pixel sensor converters 100 as described can reduce the readout noise to achieve a higher signal-to-noise ratio. Also, since the pixel sensor converters 100 are working at very low speed in the subthreshold region, they consume very low power. In addition, the readout speed is not as limited by bus capacitance so higher frame rates may be possible. A concern with previous designs of delta-sigma pixel sensors is that the designs provide a large pixel size. In previous designs of non delta-sigma pixel sensors it would not be possible to provide a pixel sensor in which both high signal-to-noise ratio and high dynamic range was achieved.

It will be appreciated to the skilled reader that the pixel sensor, image sensor array, processing circuitry, image sensor, and/or other features of particular apparatus may be provided by apparatus arranged such that they become configured to carry out the desired operations only when enabled, e.g. switched on, or the like. In such cases, they may not necessarily have the appropriate software loaded into the active memory in the non-enabled state (e.g. switched off state) and only load the appropriate software in the enabled state (e.g. on state). The apparatus may comprise hardware circuitry and/or firmware. The apparatus may comprise software loaded onto memory.

It will be appreciated that any of the aforementioned pixel sensors, image sensor arrays, image sensors, etc. may have other functions in addition to the mentioned functions, and that these functions may be performed by the same circuit/apparatus/elements.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims.

The applicant indicates that aspects of the present invention may consist of any such individual feature or combination of features. In view of the foregoing description it will be evident to a person skilled in the art that various modifications may be made within the scope of the invention.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The embodiments of the invention in which an exclusive property or privilege is claimed are defined as follows:

1. A pixel sensor converter for an image sensor array, the pixel sensor converter comprising:
    a pixel-level delta-sigma converter comprising a modulator and a decimator; wherein the modulator is configured to be in communication with a detector and is configured to sample an analogue signal received from a detector at a particular sampling rate, the modulator further configured to provide a bit stream of a particular bit rate, such a bit stream corresponding to a sampled analogue signal; and wherein
    the decimator is in communication with the modulator, and is configured to receive and modify a bit stream provided from the modulator in order to provide a digital output signal, such a digital output signal representative of an analogue signal received at the modulator, but having a reduced bit rate than a corresponding bit stream provided by the modulators;
    the decimator is configured to modify serially a received bit stream; and
    the decimator comprises an accumulator in order to modify a bit stream, the accumulator comprising a 1-bit register and a 1-bit adder configured to add together bits associated with a received bit stream.

2. A pixel sensor converter according to claim 1, wherein the accumulator further comprises a shift register, the shift register configured to store the sum of bits added.

3. A pixel sensor converter according to claim 1, wherein the accumulator comprises at least one of: pulsed latches; D-type flip flops; and D-type flip flops each made from two pulsed latches.

4. A pixel sensor converter according to claim 1, wherein the decimator is configured to filter bits associated with a bit stream in order to provide a filtered bit stream.

5. A pixel sensor converter according to claim 4, wherein the decimator is configured to act as a finite impulse response filter.

6. A pixel sensor converter according to claim 4, wherein the decimator is configured to act as a parabolic finite impulse response filter.

7. A pixel sensor converter according to claim 5, wherein the pixel sensor converter is configured to receive coefficients for use in the decimator from further processing circuitry.

8. A pixel sensor converter according to claim 7, wherein the decimator is configured to use coefficients and bits from a bit stream serially in order to provide a filtered output, such a filtered output usable to provide a digital signal output.

9. A pixel sensor converter according to claim 8, wherein the decimator is configured to AND received coefficients with each bit in order to provide a filtered output.

10. A pixel sensor converter according to claim 1, wherein the modulator is a first order modulator.

11. A pixel sensor converter according to claim 10, wherein the modulator comprises a modified regenerative latch comparator comprising one or more power limiters.

12. A pixel sensor converter according to claim 11, wherein the one or more power limiters are associated with one or more branches of the comparator, the one or more power limiters configured to limit the maximum current in the one or more branches.

13. An image sensor array comprising a plurality of pixel sensors converters according to claim 1.

14. An imaging device comprising an image sensor according to claim 13, wherein the imaging device is one of: a photographic device, a video device, portable electronic device.

15. A column sensor for an image sensor array, the column sensor comprising a plurality of pixel sensors, each pixel sensor comprising:
    a pixel-level modulator of a delta-sigma converter, the modulator configured to be in communication with a detector and configured to sample an analogue signal received from a detector at a particular sampling rate, the modulator further configured to provide a bit stream of a particular bit rate, such a bit stream corresponding to a sampled analogue signal; and
    wherein the column sensor comprises a decimator of a delta-sigma converter, the decimator in communication with the modulators of the pixel sensors, the decimator configured to receive and modify serially each bit stream from the one or more modulators in order to provide a digital output signal.

* * * * *